US 6,617,056 B1

(12) United States Patent
Hara et al.

(10) Patent No.: US 6,617,056 B1
(45) Date of Patent: Sep. 9, 2003

(54) TRANSPARENT CONDUCTIVE LAMINATE, ITS MANUFACTURING METHOD, AND DISPLAY COMPRISING TRANSPARENT CONDUCTIVE LAMINATE

(75) Inventors: Hiroshi Hara, Tokyo (JP); Seiji Tsuboi, Tokyo (JP)

(73) Assignee: Teijin Ltd., Osaka (JP)

( * ) Notice: Subject to any disclaimer, the term of this patent is extended or adjusted under 35 U.S.C. 154(b) by 0 days.

(21) Appl. No.: 09/673,854

(22) PCT Filed: Feb. 23, 2000

(86) PCT No.: PCT/JP00/01033

§ 371 (c)(1),
(2), (4) Date: Oct. 23, 2000

(87) PCT Pub. No.: WO00/51139

PCT Pub. Date: Aug. 31, 2000

(30) Foreign Application Priority Data

Feb. 24, 1999 (JP) ............................................. 11-046156

(51) Int. Cl.⁷ ................................................. B32B 9/04
(52) U.S. Cl. ....................... 428/697; 428/1.33; 428/412; 428/432; 428/480; 428/702; 427/164; 204/192.14; 204/192.22
(58) Field of Search ................................. 428/1.33, 412, 428/432, 480, 697, 702; 204/192.14, 192.22; 427/164

(56) References Cited

U.S. PATENT DOCUMENTS 4,835,061 A * 5/1989 Ohta et al. .................. 428/469

FOREIGN PATENT DOCUMENTS

| JP | 61-79647 | 4/1986 |
| JP | 2-63736 | 3/1990 |
| JP | 7-79003 | 3/1995 |
| JP | 8-77845 | 3/1996 |
| JP | 2000-129427 | 5/2000 |

OTHER PUBLICATIONS

M. Rottman. H. Hennig, B. Ziemer et al., Journal of Materials Science 31 (1996) pp. 6495–6500 (no month).
International Search Report, PCT/JP00/01o33, May 30, 2000.

* cited by examiner

Primary Examiner—Deborah Jones
Assistant Examiner—Andrew T Piziali
(74) Attorney, Agent, or Firm—Sughrue Mion, PLLC (57) ABSTRACT

A transparent conductive laminate in which a crystalline transparent conductive film substantially made of In—Sn—O on a transparent substrate composed of a thermoplastic polymer film, is provided. The crystalline part of the transparent conductive film (ITO-film) has a specific crystalline structure in which the X-ray diffraction intensity from the (222) crystal plane or the (440) crystal plane is highest, and [$X_{440/222}$], the ratio of the X-ray diffraction intensity from the (440) crystal plane to that from the (222) crystal plane, is within the range of 0.2 to 2.5. The laminate has a low resistivity, and it is useful as an electrode material for a liquid crystal display, an electroluminescence device, a touch panel or the like. The transparent conductive laminate can be manufactured by combining the control of film fabricating atmosphere during sputtering and a heat treatment under specific conditions after film fabricating.

29 Claims, 2 Drawing Sheets

TRANSPARENT CONDUCTIVE LAMINATE, ITS MANUFACTURING METHOD, AND DISPLAY COMPRISING TRANSPARENT CONDUCTIVE LAMINATE

TECHNICAL FIELD

The present invention relates to a transparent conductive laminate having an In—Sn—O transparent conductive film. More specifically, this invention relates to a low resistant transparent conductive laminate having a crystalline In—Sn—O transparent conductive film on a transparent film substrate made of a thermoplastic polymer, a manufacturing process therefore and a display comprising the laminate.

BACKGROUND ART

As electrodes of various kinds of display devices such as a liquid crystal display, an electroluminescence device or the like, or a solar cell, a thin film material with transparency and conductivity (hereafter, referred as "transparent conductive film") which shows high visible light transmittance and low electrical resistance is inevitable. Further, accompanying recent rapid popularization of portable mobile terminals, and miniaturization and weight reduction of their terminals, as substrates to be used in display devices or the like by forming a transparent conductive film on its surface, materials having lighter weight, higher flexibility and higher shock resistance than conventional ones are required. Under these circumstances, the use of a transparent conductive laminate having a transparent conductive film mainly composed of In (indium)—Sn (tin)—O (oxygen) (hereafter, referred as "ITO-film") fabricated onto a thermoplastic polymer film substrate having lighter weight, higher flexibility and higher shock resistance than glass used as a substrate, is now growing.

When a color display device is intended to be formed by using a transparent conductive laminate having an ITO-film fabricated onto such a film substrate, a resistivity of the ITO-film is desirably about $2 \times 10^{-4}$ $\Omega \cdot cm$.

However, an ITO-film fabricated onto a film substrate by DC magnetron sputtering, RF magnetron sputtering, vacuum evaporation method, ion-plating method or the like generally has a higher value of sheet resistance than an ITO-film fabricated onto a glass substrate.

One of the reasons is that only an ITO-film having no more than about 300 nm in thickness can be fabricated onto a film substrate due to the fact that the rigidity against the bending of thermoplastic polymer film substrate is smaller than that of glass substrate. That is, when it is intended to increase the thickness of the ITO-film from that thickness, it is not seldom that the film curls or cracks are fabricated onto the ITO-film, due to the stress of the ITO-film.

Another reason is that the heat resistance of thermoplastic polymer film substrate is lower than that of glass, and the process temperature fabricating an ITO film on the film substrate must be set at a lower temperature than that on a glass substrate; therefore, the crystals of the ITO-film do not grow sufficiently during film forming.

Incidentally, the structure of an ITO-film having crystalline parts is analyzed by X-ray diffraction method. In a polycrystalline ITO, three strong diffraction lines are observed in X-ray diffraction method, and they are defined by Miller indices. These are attributable to the diffraction lines from crystal planes (222), (400) and (440), from the lower angle side. It has been reported that these diffraction lines from the crystal planes (222), (400) and (440) appear around 30.5° (2θ), around 35° (2θ) and around 50.5° (2θ), respectively when the X-ray source is Cu—Kα. For example, in the literature titled "transparent conductive film" ("HYOUMEN" vol. 18, No. 8 (1980) 440–449), an X-ray diffraction pattern of a crystalline ITO-film which was made by an vacuum evaporation method on a polyester film substrate and heat-treated is shown in FIG. 4. An X-ray diffraction pattern of a crystalline ITO-film which was fabricated onto a glass substrate by sputtering is shown in "SHINKU" vol. 30, No. 6, 546–554. The X-ray diffraction charts shown in these literatures have peaks attributable to the diffraction from crystal planes. (222), (400) and (440).

It has been commonly known that the structure and electrical properties of an ITO-film fabricated onto a glass substrate by DC magnetron sputtering strongly depend on the film-fabricating temperature; and a film having a state of amorphous or a mixture of amorphous and crystalline is formed when a film formation process is carried out by keeping the glass substrate at room temperature.

Regarding an ITO-film fabricated onto a glass substrate, in order to reduce the resistivity of the film, a method in which crystalline orientation is controlled so that (400) crystal plane becomes parallel to the surface of the substrate has been proposed. For example, JP-A 7-90550 (JP-A means Japanese unexamined patent application) has descried that an ITO-film formed in such a manner that (100) direction, i.e., (400) face, is parallel to the substrate has a decreased resistivity. It becomes important to heat the substrate at a high temperature exceeding 200° C. during ITO-film fabricating in order to realize such a crystalline orientation. Several studies have been carried out regarding crystalline orientation control for decreasing a resistivity in a so-called high temperature process in which film fabricating is carried out while keeping a substrate temperature at 200° C. or higher as mentioned above.

Further, it is known that the structure of an ITO-film fabricated onto a glass substrate largely differs depending on a film fabricating atmosphere. For example, JP-A 9-50712 discloses a method for controlling an ITO film structure, that is, the particle sizes and the number of crystals are controlled by introducing water vapor, an inert gas, into the atmosphere. In addition, JP-A 8-92740 discloses a method for controlling film structure by using a sputtering apparatus, and the method actively removes impurity gas, and at the same time constitutes a vacuum system of $4.0 \times 10^{-4}$ Pa.

However, in an ITO-film formation on a thermoplastic polymer film substrate, since the softening point of a commonly used polymer film is lower than 200° C., the film substrate can not be heated at a high temperature exceeding 200° C.; and thereby such a high process-temperature exceeding 200° C. as in the case of ITO-film formation on glass substrate can not be used. Hence, in a transparent conductive laminate using a thermoplastic polymer film substrate, crystals of an ITO-film can not be sufficiently grown, and as a result, such a low sheet resistance as in the case where a glass substrate is used can not be realized.

That is, in a transparent conductive laminate using a thermoplastic polymer film substrate, an ITO film fabricating at such a high temperature as in the case of a laminate fabricated onto a glass substrate can not be realized, and further the thickness of the ITO-film is limited; and accordingly a laminate having a conductive film of low resistivity has not been provided yet.

Under these circumstances, the main object of the present invention is to provide a laminate in which the resistance of a surface layer is significantly decreased without losing the merits of the laminate having an ITO-film fabricated onto a thermoplastic polymer film substrate.

Another object of the present invention is to provide a process for manufacturing a transparent conductive laminate having a crystalline ITO-film fabricated by sputtering on a polymer film substrate kept at about room temperature. The process is characterized in that the transparent conductive laminate having an extremely lower resistivity and a better light transmittance in its ITO film than a transparent conductive laminate fabricated onto a conventional thermoplastic polymer film substrate is produced by combining the positive controlling of ITO-film's fine structure through the control of film-forming atmosphere during sputtering, with crystal growth through a heat treatment at a relatively low temperature.

A further object of the present invention is to provide a display device using the above-mentioned laminate as an electrode.

DISCLOSURE OF THE INVENTION

The inventors of the present invention pursued studies to provide a transparent conductive laminate in which an ITO-film having a low sheet resistance is fabricated onto a thermoplastic polymer film substrate; through the studies, they became to consider that the reduction of the resistivity of the ITO-film was accomplished not by the increasing in the thickness of the ITO-film, but by the substantial reduction of the resistivity of the ITO-film itself, and for this purpose, the control of the fine structure of the ITO-film was extremely important. Further, they considered that the reason why the reduction of the resistivity and the control of the fine structure of an ITO-film fabricated onto a film was not attained in the conventional technology was mainly due to the fact that water remaining in an atmosphere of sputtering could not be controlled in a perfect manner.

And, paying attention on making the best use of the characteristics of a transparent conductive laminate comprising a lightweight thermoplastic polymer film substrate having excellent shock resistance and flexibility, the inventors of the present invention studied methods for decreasing the resistivity of the ITO-film without increasing the temperature of the film substrate above the softening point of the film substrate during a sputtering process and a subsequent heat treatment.

As a result, it has become clear that if an ITO-film is formed by setting a film substrate temperature at a desired temperature of lower than 80° C. and controlling a partial pressure of each gas in a film-forming atmosphere in a specific range, and the obtained ITO-film is further subjected to a treatment under appropriate conditions, a new structure is formed in the crystals of the ITO-film on the film substrate, and especially the abundance ratio of (440) orientation to (222) orientation is controlled in a special range different from the conventional one, and as a result, the resistivity of the ITO-film becomes extremely lower than the conventional one. Further, it was found that the abundance ratio of the (440) orientation to the (222) orientation also can be controlled by the above-mentioned method. And, it has been confirmed that in a new transparent conductive laminate whose ITO-film has a fine structure controlled in this manner, the resistivity of the ITO-film is decreased to almost a half of that of the conventional transparent conductive laminate on a film substrate.

The present invention has been completed as a result of the studies repeated based on such findings. It relates to a new transparent conductive laminate having an ITO-film which is fabricated onto a thermoplastic polymer film, and has a specific crystalline structure and an extremely low resistivity due to the controlling of the atmosphere during ITO-film forming and the controlling of the fine structure based on the controlling the atmosphere.

That is, the transparent conductive laminate of the present invention is a laminate having a crystalline ITO-film fabricated onto a film substrate consisting of a transparent thermoplastic polymer. The laminate has a characteristic crystalline orientation, i.e. in the X-ray diffraction of the ITO-film, the X-ray diffraction intensity from crystal plane (222) or (440) is the highest, and $[X_{440/222}]$, the ratio of the X-ray diffraction intensity from the (440) crystal plane to that from the (222) crystal plane of the crystalline part, is within the range of 0.2 to 2.5, preferably 0.3 to 2.0, further preferably 0.3 to 1.2.

In a preferred mode of the laminate, $[X_{400/222}]$, the ratio of the X-ray diffraction intensity from (400) crystal plane to that from the (222) crystal plane of the crystalline part, is in the range of 0 to 0.2.

Hereafter, a substrate consisting of a thermoplastic polymer film and the transparent conductive film fabricated onto the substrate, which constitute the transparent conductive laminate of the present invention, will be explained one by one.

<Substrate Consisting of Thermoplastic Polymer Film>

In the present invention, as thermoplastic polymer film to be the substrate, a transparent film consisting of a film-forming thermoplastic polymer is used.

As the above-mentioned thermoplastic polymer, a thermoplastic polymer of a single component such as polycarbonate, polyethylene terephthalate, polyethylene 2,6-naphthalate, polyether sulfone or polyarylate, or a copolymer obtained by copolymerizing the second component and the third component on the polymer for imparting an optical function and/or a mechanical property-stabilizing function under a high temperature is used.

Especially, in the field where excellent optical properties are required, a polycarbonate which is mainly composed of a bisphenol component and has an excellent transparency is suitable. Examples of the bisphenol component include 2,2-bis(4-hydroxyphenyl)propane (common name of bisphenol A), 1,1-bis(4-hydroxyphenyl)cydohexane (common name of bisphenol Z), 1,1-bis(4-hydroxyphenyl)-3,3,5-trimethylcyclohexane, 9,9-bis(4-hydroxyphenyl) fluorene and 9,9-bis(3-methyl-4-hydroxyphenyl)fluorene. Two or more kinds of these bisphenol components may be combined. That is, such a polycarbonate may be a homopolymer, a copolymer or a blend of two or more kinds of polycarbonates.

Further, in order to impart a new function, plural kinds of thermoplastic polymers can be blended in the range where the transparency is not lost. As far as the transparency is not lost, additives such as a stabilizer and a flame retardant may be added to the polymers. Furthermore, the substrate film may be a multilayered film produced by co-extruding multiple components.

The transparent film of a thermoplastic polymer can be produced by any method including melt extrusion and casting, but the film obtained from an organic solvent solution of polycarbonate by casting is most preferred because it is especially excellent in optical properties. The film may be stretched in one direction or two directions as need.

There is no limitation on the thickness of a thermoplastic polymer film used as the substrate in the present invention;

however, the film thickness is preferably 0.01 to 0.4 mm in consideration of specific applications. Especially, the film having a thickness of about 0.1 to 0.4 mm is preferable in the optical application of a liquid crystal display device or the like, from view point of visibility.

When a transparent conductive laminate is used for liquid crystal display device which uses linearly polarized light, the thermoplastic polymer film substrate having excellent optical isotropy is preferred, and the retardation in visible range is preferably 20 nm or less, especially preferably 10 nm or less.

The above-mentioned thermoplastic polymer film substrate may have coating layer consisting of at least one or more layers on one side or both sides of the film to improve the adhesivity to the ITO-film to be fabricated onto it, various kinds of durability of the film substrate or the gas barrier properties of the film. The coating layer is formed from an inorganic material, an organic material or their composite material depending on the purpose.

As the coating layer, a resin component such as an acrylic resin, an urethane resin, an ultraviolet curable resin, an epoxy resin, a silicate resin or a phenoxy resin, or a mixture of the resin component and inorganic particles such as alumina, silica or mica can be used. Further, a metal alkoxide may be mixed. Furthermore, the film substrate may be formed in such a manner that the surface layer has coating layer functions by co-extruding two or more layers on film substrate forming.

In coating by a technique of PVD (i.e., Physical Vapor Deposition) or CVD (i.e., Chemical Vapor Deposition), an oxide such as magnesium oxide, aluminum oxide, silicon oxide, calcium oxide, barium oxide, tin oxide, indium oxide, tantalum oxide, titanium oxide or zinc oxide, a nitride such as silicon nitride, titanium nitride or tantalum nitride, or a fluoride such as magnesium fluoride or calcium fluoride can be used as a coating material singly or in a mixture of these substances.

Concretely, for example, in order to improve adhesivity to the ITO-film, it is preferable that a silicate resin, an epoxy resin, an ultraviolet curable resin or the like is used as the coating material. For improving gas barrier property, it is preferable that coating is preferably performed by using a silicate resin, an oxide such as magnesium oxide, aluminum oxide, silicon oxide, calcium oxide, barium oxide, tin oxide, indium oxide, tantalum oxide, titanium oxide or zinc oxide, a nitride such as silicon nitride, titanium nitride or tantalum nitride, or a fluoride such as magnesium fluoride or calcium fluoride, singly or in a mixture of these substances.

Preferable coating thickness is 0.01 to 20 $\mu$m (10 to 20,000 nm); more preferably, it is suppressed to about 10 $\mu$m or less.

For forming a coating layer, in most cases, an application method using a coater, a spray method, a spin coat method, an inline coat method or the like can be used. PVD or CVD such as a sputtering method or an evaporation method also may be used.

In the above substrate film, light transmittance is preferably 80% or more, especially preferably 85% or more, in every case.

<Transparent Conductive Film (ITO-film)>

An ITO-film of the transparent conductive laminate according to the present invention has high crystallinity, and the diffraction intensity from (222) crystal plane or that from (440) crystal plane in the X-ray diffraction from the crystalline part shows the most strong diffraction pattern. And, $[X_{440/222}]$, the ratio of the X-ray diffraction intensity from the (440) crystal plane to that from the (222) crystal plane of the crystalline part, is in the range of 0.2 to 2.5.

Especially, a laminate having the above ratio $[X_{440/222}]$ in the range of 0.3 to 2.0 is preferable since the resistivity of the ITO-film is decreased to about $2 \times 10^{-4} \Omega \cdot$cm. When a further lower resistivity is desired, the $[X_{440/222}]$ is preferably 0.3 to 1.8, more preferably 0.3 to 1.2.

On the other hand, when the $[X_{440/222}]$ is less than 0.2, the (222) crystal plane of the ITO-film is extremely strong in many case, and this makes the stress of the ITO-film extremely strong and the ITO-film apt to have cracks. When the $[X_{440/222}]$ exceeds 2.5, the resistivity of the ITO-film is not decreased sufficiently low in many case. So, in either case, the purpose of the present invention is hardly attained.

In the preferred transparent conductive laminate of the present invention, the X-ray diffraction intensity from (400) crystal plane, which is another crystal orientation, is in the range of 0.2 time or less the X-ray diffraction intensity from the (222) crystal plane. That is, $[X_{400/222}]$ the ratio of the X-ray diffraction intensity from the (400) crystal plane to that from the (222) crystal plane, is in the range of 0 to 0.2. In an ITO-film whose resistivity is further decreased, the $[X_{400/222}]$ is suppressed into the range of 0.01–0.18.

Here, X-ray diffraction is measured, for example, as follows. That is, it is determined by using "Rotaflex™" RU-300 manufactured by Rigaku Corporation without separating the ITO-film from a laminate. The optical arrangement is determined according to a focusing method of Bragg-Brentano by using Cu—K$\alpha$ ray (wave length: 1.541 Å) as a light source under the conditions of the X-ray power of 50 kV and 200 mA, and an optical system of a divergence slit of 1°, a scattering slit of 1° and a receiving slit of 0.15 mm. Herein, a graphite monochromater is also used.

On the X-ray diffraction chart, diffractions from crystal planes (222), (400) and (440) appear at 30.5° (2$\theta$), at 35° (2$\theta$) and around 0.5° (2$\theta$), respectively. The diffraction intensities from the crystal planes (222), (400) and (440) are each defined as follows: the difference between the intensity of the peak top of the diffraction peak of an ITO-film, and the intensity of the base line comprising the straight line derived from the base line of the peak is readout, and the difference is defined as the diffraction intensity from the ITO-film. Further, the diffraction intensities are directly readout without specifically performing the separation of Cu, K $\alpha$ 1 and K $\alpha$ 2 rays of the light source.

The X-ray diffraction apparatus for determining X-ray diffraction intensity as to the ITO-film of the transparent conductive laminate of the present invention is not limited to the above apparatus, and of course another apparatus having an equivalent performance is available.

Further, the resistivity of the ITO-film, the total light transmittance of the laminate, the ITO-film thickness and the like are measured as shown below.

The transparent conductive film is constituted with a complex oxide containing indium oxide as the main component and at least one kind of oxide out of oxides having a large band gap such as tin oxide, zinc oxide, antimony oxide, aluminum oxide, gallium oxide, cerium oxide, magnesium oxide, cadmium oxide, copper oxide, tungsten oxide and rhenium oxide. Among them, an ITO-film containing indium oxide as the main component and 2.5 to 25 wt. %, especially 7.5 to 17.5 wt. % of tin oxide, which is formed by sputtering using a target mainly composed of indium oxide and tin oxide, is preferable from view points of the improvements regarding resistance and light transmittance. Among them, an ITO-film consisting of 95 to 85 wt. % of indium oxide and 5 to 15 wt. % of tin oxide is especially preferable from view points of resistance and light transmittance.

The film thickness of a transparent conductive film (ITO-film) fabricated onto a thermoplastic polymer film substrate is preferably 10 to 300 nm, especially preferably 20 to 200 nm. The film thickness of the transparent conductive film is appropriately selected depending on the usage of the laminate. However, when it is too thick, the flexibility of the laminate would be decreased, and therefore having a transparent conductive film 300 nm or more thick is not preferable. Also, the thickness of ITO-film of less than 10 nm is not preferable since the property as a transparent conductive film becomes extremely poor. Thereby, it is preferable to select film thickness from 10 to 300 nm, especially 20 to 200 nm, depending on the usage of the transparent conductive laminate.

<Transparent Conductive Laminate>

The above-mentioned transparent conductive laminate of the present invention, in which a crystalline transparent conductive film (ITO-film) substantially consisting of In—Sn—O is fabricated onto a transparent polymer film substrate, has the surface conductive layer having a resistivity of $1.3 \times 10^{-4}$ to $4.5 \times 10^{-4}$ Ω·cm and excellent in flexibility, shock resistance and transparency. Especially, a transparent conductive laminate satisfying all of the following constituent requirements is preferable:

(i) the transparent substrate is a transparent thermoplastic polymer film having a thickness of 0.01 to 0.4 mm and (ii) a transparent conductive film fabricated onto the substrate film has the following features;

(A) a transparent conductive film made of a metal oxide containing indium oxide as the main component and containing 2.5 to 25 wt. % of tin oxide, and has a thickness of 10 to 300 nm, (B) in the crystalline part, the X-ray diffraction intensity from (222) crystal plane or (440) crystal plane is the strongest, and $[X_{440/222}]$, the ratio of the X-ray diffraction intensity from the (440) crystal plane to that from the (222) crystal plane, is in the range of 0.2 to 2.5, preferably in the range of 0.3 to 1.2, and $[X_{400/222}]$ the ratio of the X-ray diffraction intensity from (400) crystal plane to that from the (222) crystal plane of the crystalline part of the transparent conductive film, is in the range of 0 to 0.2, and further (C) the resistivity of the transparent conductive film is $1.3 \times 10^{-4}$ to $3.0 \times 10^{-4}$ Ω·cm.

This laminate not only has a particularly low resistivity of the transparent conductive film but also has excellent transparency, that is, the total light transmittance is 80% or more, preferably 84 to 95%.

A transparent conductive laminate having these properties and having a thermoplastic polymer film as the substrate is an unknown new one, and it is suitable for wider usage than the conventional one and excellent in practicality.

<Process for Manufacturing Transparent Conductive Laminate>

The transparent conductive laminate of the present invention having the above-mentioned properties can be produced by a process in which a transparent conductive film is fabricated onto a transparent substrate made of a thermoplastic polymer film by a sputtering method using a target mainly composed of In—Sn—O, which is characterized in that the process comprises;

(a) the transparent conductive film is fabricated onto the substrate while the ratio of an oxygen partial pressure to a water partial pressure in a film forming atmosphere during sputtering is kept substantially zero or in the range of 10 to 1000, the ratio of the water partial pressure to an inert gas partial pressure is kept in the range of $2.5 \times 10^{-6}$ to $7 \times 10^{-4}$, and further during the film forming, the temperature of the substrate is kept lower than 80° C., and (b) subsequently, the laminate having a transparent conductive film fabricated onto the substrate is heat-treated at 80 to 150° C. for 0.5 to 12 hr in an oxygen-containing atmosphere.

Especially preferable process is characterized in that the manufacturing process for a transparent conductive laminate by fabricating a transparent conductive film onto a transparent film substrate consisting of a thermoplastic polymer by sputtering using a target mainly composed of In—Sn—O comprises;

(a-1) a transparent conductive film 10 to 300 nm in thickness is fabricated onto a transparent thermoplastic polymer film substrate 0.01 to 0.4 mm in thickness by DC magnetron sputtering, (a-2) the film fabricating is started while keeping the pressure at $2.5 \times 10^{-4}$ Pa or less and a water partial pressure in the film forming atmosphere at $2.5 \times 10^{-4}$ Pa or less at first inside of vacuum chamber for the film fabrication during the said sputtering, (a-3) subsequently, the ratio of an oxygen partial pressure to the water partial pressure in the film forming atmosphere is brought into the range of 10 to 1000 and the ratio of the water partial pressure to an inert gas partial pressure is brought into the range of $2.5 \times 10^{-6}$ to $7 \times 10^{-4}$ by introducing the inert gas and oxygen into the vacuum chamber for film fabrication, or the ratio of the oxygen partial pressure to the water partial pressure in the film forming atmosphere is made substantially zero and the ratio of the water partial pressure to the inert gas partial pressure is brought into the range of $2.5 \times 10^{-6}$ to $7 \times 10^{-4}$ by introducing only the inert gas into the chamber, (a-4) the temperature of the above-mentioned film is kept below 80° C. during the film fabricating, and (a-5) thus, a laminate comprising a transparent conductive film of $4 \times 10^{-4}$ to $1 \times 10^{-3}$ Ω·cm in resistivity fabricated onto the substrate film is obtained, and (b) subsequently, the laminate is heat-treated at 80 to 150° C. for 0.5 to 12 hr in an oxygen-containing atmosphere, and thereby the resistivity of the transparent conductive film is lowered below the resistivity before the heat treatment to make it $1.3 \times 10^{-4}$ to $3 \times 10^{-4}$ Ω·cm.

As mentioned above, the manufacturing process of the present invention comprises (a) a film forming process in which a transparent conductive ITO film (In—Sn—O film) is fabricated onto a transparent thermoplastic polymer film substrate by sputtering under specific conditions, and (b) a heat treatment process in which the obtained ITO film is heat-treated under specific conditions to grow crystals of the ITO film.

Hereafter, each process will be explained one by one.

(a) Film Forming by Sputtering

In the process of the present invention, a transparent conductive film (ITO film) is fabricated onto a thermoplastic polymer film substrate by sputtering, preferably DC magnetron sputtering using a target mainly composed of In—Sn—O.

The general process and apparatus for such sputtering are explained, for example, in the fifth chapter of "Transparent Conductive Film Technology" compiled by Japan Society for the Promotion of Science, 166th Committee of Transparent Oxide Photoelectron Material (Mar. 11, 1999, by Ohmsha).

As the target for sputtering, as mentioned above, a sintered compact of a composite metal oxide consisting mainly of an oxide of indium (In) and an oxide of tin (Sn) can be used. The target to be used in the process of the present invention has preferably a sintered density of 80% or more, more preferably 90% or more, further preferably 95% or more. Further, the target may contain, in place of a part of the oxide of tin (Sn), a small amount (for example, at a ratio of 10% or less of the total) of at least one metal out of titanium (Ti), copper (Cu), zinc (Zn), germanium (Ge), antimony (Sb), gallium (Ga), cerium (Ce), tungsten (W), rhenium (Re), lead (Pb) and other metals in the form of oxide.

According to the process of the present invention, an ITO film as the transparent conductive film, is fabricated onto a substrate composed of polymer film under such conditions that the ratio of an oxygen partial pressure to a water partial pressure in the film-forming atmosphere, that is, inside a vacuum chamber as the film fabricating section is substantially zero or in the range of 10 to 1000, the ratio of the water partial pressure to an inert gas partial pressure is in the range of $2.5 \times 10^{-6}$ to $7 \times 10^{-4}$, and further the temperature of the substrate is kept below 80° C., during sputtering.

In the process of the present invention, as mentioned above, it is important to control fine structure and resistance through the control of the film forming atmosphere during sputtering.

The reduction of impurity gas content in the above-mentioned vacuum chamber as the film-fabricating section brings the reduction of the amount of the impurities contained in a formed ITO film. However, the reduction of the amount of the impurity gas contained in the ITO film is a sufficient condition but it is not a necessary condition for making the resistivity low. This is attributable to the fact that the resistance of the ITO film is closely related to the amount of a carrier present in the film. The formation of the carrier depends strongly on the temperature of the substrate during ITO film fabricating, and in an ITO film obtained while keeping the temperature of the substrate film in the range from room temperature to 80° C., the sufficient amount of the carrier is not formed in the state directly after film formation. Further, in an ITO film containing water as impurity, the resistivity can be somewhat decreased under specific film fabricating conditions; however, the hydrogen atoms constituting water bind preferentially with oxygen and suppress the formation of the carrier, in the ITO film. It is considered that, in the ITO film formed in a vacuum chamber where the water content of the film forming atmosphere has been decreased, the suppression of the carrier formation attributable to impurities is reduced, and thereby only the carrier corresponding to the substrate temperature is formed.

In the process of the present invention, water which is a residual gas component attributable to the atmosphere in a vacuum chamber and a thermoplastic polymer film substrate is controlled through back (base) pressure control and sputtering is carried out by using a vacuum chamber having an atmosphere in which the ratio of a water partial pressure to a partial pressure of the inert gas introduced into the vacuum chamber during film fabricating, that is, water partial pressure/inert gas partial pressure is controlled in the range of $2.5 \times 10^{-6}$ to $7 \times 10^{-4}$, preferably $7.0 \times 10^{-6}$ to $5 \times 10^{-4}$, more preferably $0.1 \times 10^{-4}$ to $3.5 \times 10^{-4}$, and thus the ITO film is formed. The amount of water in the atmosphere during ITO-film fabricating is controlled by largely reducing the back (base) pressure in the vacuum chamber compared with the conventional value; specifically, by improving the ultimate vacuum of a vacuum process about 10 to 100 times the conventional range (about $1.3 \times 10^{-3}$ Pa) to make it $1.3 \times 10^{-4}$ to $1.3 \times 10^{-6}$ Pa.

The smaller the ratio of a water partial pressure to a partial pressure of the introduced inert gas (water partial pressure/inert gas pressure) is, the better it is supposed to be; however, the minimum value is about $2.5 \times 10^{-6}$ considering the performance of a vacuum equipment in actual processing. However, further reduction becomes possible when the performance of the vacuum equipment is improved. On the other hand, when the ratio of water partial pressure/inert gas partial pressure exceeds $7 \times 10^{-4}$, the effect of residual gas becomes significant, and the controls of the crystal structure and the resistivity of the ITO film, which are objects of the present invention, become difficult.

The ratio of the partial pressures (water partial pressure/inert gas partial pressure) is especially preferably $5 \times 10^{-4}$ or less, further preferably $0.1 \times 10^{-4}$ to $3.5 \times 10^{-4}$, in the above-mentioned range.

Thus, in sputtering, an inert gas such as Ar (argon gas) as a process gas is introduced into a controlled vacuum chamber, and subsequently oxygen as a reaction gas is introduced. Herein, at first oxygen is not introduced but only an inert gas is introduced so that a ratio of a partial pressure of oxygen as the reaction gas to a water partial pressure (oxygen partial pressure/water partial pressure) becomes substantially zero, or the controlled amount of oxygen gas is introduced so that the ratio comes into the range of 10 to 1000, more preferably 50 to 500, further preferably 100 to 250, and film fabricating is carried out in a state where the impurities attributable to the vacuum chamber and the polymer film substrate are hardly taken into the ITO film.

When the ratio of the partial pressure of oxygen as the reaction gas to the water partial pressure (oxygen partial pressure/water partial pressure) becomes smaller than 10, the contribution of water as the reaction gas unfavorably becomes large. On the other hand, in order to make the ratio larger than 1000, it becomes necessary to construct a special exhaust system. In addition, when the ratio is larger than 1000, it is worried that hydrogen as a residual gas gives adverse effect on the ITO film though the water partial pressure can be decreased. Further, even in the state where the water partial pressure is decreased, excess oxygen possibly enters into the ITO film. The excess oxygen is not desirable since it works in the direction to decrease oxygen deficiency in the film.

However, when oxygen as the reaction gas is not introduced at all, the ratio of the oxygen partial pressure to the water partial pressure exceptionally can be made substantially zero since substantially no oxygen exists in the atmosphere. Also in this case, although it depends on the composition of the ITO film as fabricatd, fine structure almost same as the above-mentioned one can be expressed on the ITO film, and low resistivity is realized.

Further, when the back pressure control is carried out, a treatment for degassing from a polymer film substrate can be additionally combined. If the substrate is a heat resistant film, it is heated with a heat source such as infrared rays in advance so that the content of out gassing species mainly composed of water, which are absorbed and/or included in the substrate, is decreased, and then the substrate may be subjected to ITO film fabricating. For example, heating is stopped after a 2-hr heat treatment at 70° C., and the transparent polymer film substrate is cooled down to room temperature. The process can realize an excellent state of the vacuum chamber in which the residual impurity gas is extremely low. Although the back pressure control comprising a preheating treatment and subsequent cooling of the substrate film is preferable, it can be omitted if not especially needed since it is time-consuming.

In the process of the present invention, the pressure of the atmosphere for forming a transparent conductive film by sputtering, in other words, the pressure of the inside of a vacuum chamber as an ITO film fabricating section is reduced at first to $2.5\times10^{-4}$ Pa or less, preferably to $1.3\times10^{-6}$ Pa to $2.5\times10^{-5}$ Pa, and the water partial pressure in the atmosphere is set at first at $2.5\times10^{-4}$ Pa or less, preferably $1.3\times10^{-6}$ to $2.5\times10^{-5}$ Pa, and subsequently only an inert gas or an inert gas and oxygen are introduced.

The water partial pressure in the atmosphere at the vacuum chamber can be considered to almost equal to the back pressure when the ultimate degree of vacuum is in the range up to about $1\times10^{31\ 6}$ Pa; the back pressure of the vacuum chamber therefore can be regarded as the water partial pressure. The oxygen partial pressure can be calculated by using the pressure obtained by subtracting the back pressure from the total pressure during film fabricating and the flow ratio of an inert gas such as Ar to oxygen gas which has been set by a mass flow controller. When the water partial pressure and the oxygen partial pressure are determined, a differential exhaust-type in-process monitor may be used. A quadrupole mass spectrometer, which has a wide dynamic range and can work even under pressure of about 0.1 Pa, also may be used for measuring.

In the process of the present invention, by setting the pressure in a vacuum chamber, which carries out film fabricating by sputtering, at first at $2.5\times10^{-4}$ Pa or less, the water partial pressure in the vacuum chamber is made $2.5\times10^{-4}$ Pa or less, and subsequently only an inert gas is introduced into the chamber, or an inert gas and oxygen gas are introduced. In this case, it is preferable that, the pressure is set at first at $1.0\times10^{-4}$ Pa or less, further preferably $1.3\times10^{-6}$ to $2.5\times10^{-5}$ Pa, and subsequently only an inert gas is introduced or an inert gas and oxygen gas are introduced.

The ITO film forming atmosphere is composed mainly of an inert gas, oxygen and water. Here, as the inert gas, Ar, Ne, Kr, Xe or the like can be used, and it is said that the larger the atomic weight of the inert gas is, the smaller the damage on the fabricated ITO film is and the lower the resistivity is; however, Ar is preferred from the point of view of cost. Further, nitrogen, carbon monoxide, carbon dioxide, water, ammonia, laughing gas or the like may be added under an adequate control of the amount of introduction, besides oxygen.

The structure directly after the formation of the thus-obtained ITO film has a state of amorphous or of a mixture of crystalline and amorphous. And, the resistivity of the transparent conductive film in such a state i.e., before heat treatment) is $4\times10^{-4}$ to $1\times10^{-3}$ Ω·cm.

(b) Heat Treatment

As mentioned above, a laminate having an ITO film fabricated onto a polymer film substrate is subsequently heat-treated at 80 to 150° C. for 0.5 to 12 hr in an atmosphere including oxygen.

The resistivity of the transparent conductive film before the heat treatment is, as mentioned above, $4\times10^{-4}$ to $1\times10^{-3}$ Ω·cm, and this heat treatment brings the crystalline part formed in the transparent conductive film into crystalline orientation in which the above-mentioned $[X_{440/222}]$ comes into the range of 0.2 to 2.5, preferably further $[X_{400/222}]$ comes into the range of 0 to 0.2, and decreases the resistivity of the transparent conductive film to $1.3\times10^{-4}$ to $4.5\times10^{-4}$ Ω·cm, preferably to $1.5\times10^{-4}$ to $3.5\times10^{-4}$ Ω·cm.

When an ITO film fabricated under above-mentioned conditions is heated at the above-mentioned temperature for the above-mentioned time in an oxygen-containing atmosphere, an amorphous part smoothly crystallizes since the amount of impurities in the film is little, and carrier formation is accelerated by the heat generated during the crystallization and the heat brought from the outside.

Unlike rapid crystallization accompanied by the ITO film formation in a high temperature process whose substrate temperature is set at a temperature exceeding 200° C., the crystallization caused by the heat treatment which is carried out at an extremely low temperature not higher than the softening point of the polymer film substrate proceeds in a state close to thermodynamical equilibrium. Thereby, carrier-disturbing factors such as dislocation and defect in a crystal grain are decreased, and carrier formation occurs smoothly. As a result, an ITO film having an extremely low resistivity is obtained as mentioned above.

In the above-mentioned heat treatment, the laminate is heated in an oxygen-containing atmosphere at a temperature lower than the softening point of the thermoplastic polymer film substrate, specifically 80 to 150° C., preferably 90 to 140° C. for 0.5 to 12 hr, preferably 0.5 to 5 hr. Here, the heat treatment temperature means the temperature of the laminate body itself to be treated, and actually it is identical to the environmental temperature of the heat treatment. When the heat treatment temperature is lower than 80° C., crystal growth will be insufficient, and when it exceeds 150° C., there is a possibility of causing bad effects on the substrate film. When the heat treatment time is shorter than 0.5 hr, crystal growth is insufficient in some case. Although a long term heat treatment of 12 hr or more gives an objective laminate of the present invention, about 12 hr or somewhat shorter than it is practically preferable from view points of both productivity and cost.

An oxygen-containing environment is used for the heat treatment. The amount of oxygen in the atmosphere may be extremely small. That is, there is no trouble if there exists oxygen in such an amount as remain after nitrogen gas substitution or argon gas substitution performed under ordinary conditions. The heat treatment can be carried out in a vacuum of about $1.3\times10^{-2}$ Pa. On an industrial scale, the heat treatment is carried out preferably in air.

When attention is paid on the structural change before and after the heat treatment, it is found that the X-ray diffraction intensity from (440) crystal plane after heat treatment is increased from that directly after film fabrication, in an ITO film formed under the conditions for controlling the fine structure as mentioned above. The increasing amount of the diffraction intensity is evaluated by the ratio of the (440) diffraction intensities before and after the heat treatment, and the ratio of the diffraction intensity before the heat treatment to that after the heat treatment is preferably 0 to 1. It is more preferably 0 to 0.5, and in this case, an extreme lowering of the resistivity is achieved.

By the heat treatment, crystals of an ITO film grow, and the resistivity of the ITO film is decreased from that before the treatment to become $1.3\times10^{-4}$ to $4.5\times10^{-4}$ Ω·cm, preferably $1.3\times10^{-4}$ to $3.0\times10^{-4}$ Ω·cm.

<Usages and after Processing>

A transparent conductive laminate produced by the process of the present invention has a transparent conductive film having extremely low resistance fabricated onto a thin thermoplastic polymer film substrate excellent in flexibility, shock resistance and transparency, and it is free from curl of the laminate and cracking in the transparent conductive film part.

From these features, this laminate can be effectively used as an electrode substrate of a liquid crystal display device, an electroluminescence device or a touch panel. Further, it can be used in other fields such as films for a solar cell and electromagnetic wave shielding, and a surface heating body.

Further, corresponding to the usage of electrodes, it can be processed with a fine processing techniques such as wet etching, dry etching or photolithography.

<Measuring Method>

Hereafter, measuring methods in the present invention will be explained.

(1) Resistivity of ITO Film:

The resistivity of an ITO film is measured with "Loresta™" MP MCP-T350, a four-terminal ohm-meter manufacture by Mitsubishi Kagaku Co., Ltd.

In the below-mentioned examples and comparative examples, the values of resistivitys of ITO films directly after film fabrication (before heat treatment) and those after heat treatment, determined by the above-mentioned four-terminal ohm-meter are shown.

(2) Total Light Transmittance:

A total light transmittance is determined by using 300 A manufactured by Nippon Denshoku Co., Ltd., without separating a polymer film substrate from a transparent conductive film. The higher the total light transmittance is, the more desirable it is, and the total light transmittance is an important factor for optical usages of liquid crystal display device and the like.

(3) Thickness of ITO Film:

The film thickness of an ITO film is determined by measuring the level difference of the film fabricated onto a glass under the same conditions, using "Dektak™" manufactured by Sloan Co., Ltd., to determine a sputter rate, and then calculating the product of an ITO film fabricating time and the sputter rate.

(4) Film Thickness:

A film thickness is measured by using "DIGIMATIC™" micrometer manufactured by Mitsutoyo Co., Ltd.

Figure 2:
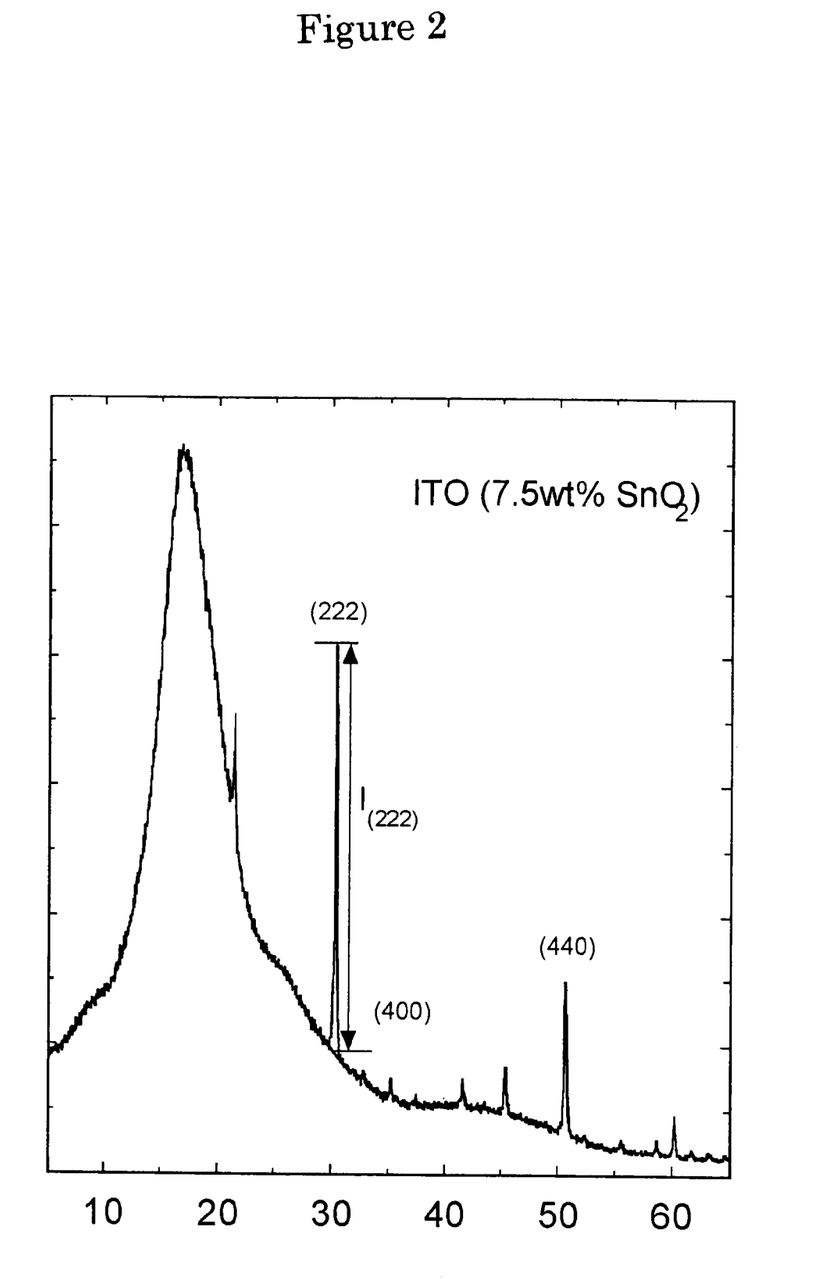
FIG. 2 is an example of an X-ray diffraction chart of an ITO film after heat treatment of the transparent conductive laminate of the present invention and shows the X-ray diffraction chart after heat treatment of a film fabricated under conditions of the below-mentioned Example 2.

(5) X-ray Diffraction Intensity:

As mentioned above, X-ray diffraction intensities of an ITO film are measured by using "Rotaflex™" RU-300 manufactured by Rigaku Corporation. The optical arrangement is determined according to a focusing method of BraggBrentano by using Cu—Kα a ray (wave length: 1.541 Å) as a light source under the conditions of the X-ray power of 50 kV and 200 mA, and an optical system of a divergence slit of 1°, a scattering slit of 1°, and a receiving slit of 0.15 mm. A graphite monochromater is also used. To determine a diffraction ray intensity from crystal plane (222), (400) or (440) on an X-ray diffraction chart, the difference between the peak top intensity of a diffraction peak and the base line intensity obtained by drawing the straight base line of the peak is read out as shown in FIG. 2, and this is let a diffraction intensity.

(6) Softening Point (Glass Transition Temperature) of a Film-constituting Polymer:

To determine the softening point (glass transition temperature) of a film-constituting polymer, the glass transition temperature is measured by using 2920 MDSC manufactured by TA Instruments Co., Ltd., and this is let the softening point.

BRIEF DESCRIPTION OF DRAWINGS

The abscissa of each figure shows diffraction angles (2θ), and the ordinate shows diffraction intensities at the diffraction angles.

In the figures, the peaks indicated by (222), (400) and (440) are diffraction intensities from (222), (400) and (440) crystal planes of a crystal of an ITO film, respectively, and each diffraction intensity is expressed by the height of each peak intensity from the base line. For example, in FIG. 2, the height shown by $I_{(222)}$ in the figure is a diffraction intensity from (222) crystal plane.

BEST MODE FOR CARRYING OUT THE INVENTION

The present invention will be explained farther in detail hereafter with examples, while the range of the present invention is not restricted by the examples.

Oxygen partial pressure/water partial pressure and water partial pressure/argon partial pressure out of film fabricating parameters in each example are shown together in the following Table 1. Further, physical parameters and structural parameters such as resistivity before and after heat treatment are also shown together in Table 1.

The polymer film substrate used in each example is as follows.

Film A: a transparent film produced by subjecting a polycarbonate (softening point of 155° C.) prepared from bisphenol A to casting.

Film B: a transparent film produced by subjecting a copolymer polycarbonate (copolymerization molar ratio of 40/60, softening point of 190° C.) prepared from 1,1-bis(4-hydroxyphenyl)-3,3,5-trimethylcyclohexane and bisphenol A, to casting.

Film C: a transparent film produced by subjecting a copolymer polycarbonate (copolymerization molar ratio of 50/50, softening point of 210° C.) prepared from 9,9-bis(4-hydroxyphenyl)fluorene and bisphenol A, to casting.

EXAMPLE 1

Sputtering was performed at a power density of 1 W/cm² by using a sintered target consisting of In—Sn—O by DC magnetron sputtering to fabricate a film 130 nm in thickness onto a substrate film A 0.1 mm in thickness at 20° C. of substrate temperature from $In_2O_3$ containing 5 wt. % of $SnO_2$, and as a result, a laminate was obtained.

In this process, in a DC magnetron sputtering apparatus, the back (base) pressure of a vacuum chamber (film fabricating section) was set at $1.3 \times 10^{-5}$ Pa at first, and then argon as an inert gas was introduced into the vacuum chamber to make the total pressure 0.4 Pa. Subsequently, oxygen was introduced in such a manner that the ratio of an oxygen partial pressure to a water partial pressure became 115. The oxygen partial pressure determined by calculating from the oxygen flow rate in a mass flow controller and the total pressure was $1.6 \times 10^{-3}$ Pa (hereafter, oxygen partial pressures in examples and comparative examples were determined in the same method). The ratio of the water partial pressure to an inert gas partial pressure was $3.3 \times 10^{-5}$. The water partial pressure was let to be $1.3 \times 10^{-5}$ Pa, since the water partial pressure could be considered to be equal to the back pressure.

Directly after film fabrication, the resistivity of the ITO film was $4.6 \times 10^{-4}$ Ω·cm, the total light transmittance of the laminate was 81%, and the X-ray diffraction intensities from (222), (400) and (440) crystal planes of the ITO film were 8500 cps, 200 cps and 1400 cps, respectively.

After these steps, the laminate was placed in a heat treating tank and heat-treated at 130° C., which was a temperature lower than the softening point of the polycarbonate comprising the substrate film A without applying tension in air. The resistivity of the ITO film of the transparent conductive laminate thus-obtained was $4.0 \times 10^{-4}$ Ω·cm after a 0.5-hr heat treatment. The extension of the heat treatment to 4 hrs did not change the resistivity. The total light transmittance of the transparent conductive laminate was improved to 82% after the 4-hr heat treatment.

The X-ray diffraction intensities from (222), (400) and (440) crystal planes of the ITO film of the transparent conductive laminate after the 4-hr heat treatment were 10,000 cps, 240 cps and 2000 cps, respectively. So, $[X_{440/222}]$, the ratio of the X-ray diffraction intensity from the (440) crystal plane to that from the (222) crystal plane, was 0.2, and $[X_{400/222}]$ the ratio of the X-ray diffraction intensity from the (400) face to that from the (222) face, was 0.02. Further, the ratio of the X-ray diffraction intensity from the (440) face before heat treatment to that after heat treatment was 0.7.

EXAMPLE 2

A film 130 nm in thickness was fabricated onto a substrate film A 0.1 mm in thickness at 20° C. of substrate temperature from $In_2O_3$ containing 7.5 wt. % of $SnO_2$ by using a DC magnetron sputtering apparatus same as that used in Example 1, and as a result, a transparent conductive laminate was obtained.

In this process, the base pressure in a vacuum chamber was set at the same level as in Example 1, and then argon as an inert gas was introduced into the vacuum chamber to make the total pressure 0.4 Pa. Further, oxygen was introduced in such a manner that the ratio of an oxygen partial pressure to a water partial became 160. The oxygen partial pressure was $2.1 \times 10^{-3}$ Pa. Further, the ratio of the water partial pressure to an inert gas pressure was $3.3 \times 10^{-5}$.

Directly after film formation, the resistivity of the ITO film was $4.8 \times 10^{-4}$ Ω·cm, and the total light transmittance of the laminate was 82%.

Figure 1:
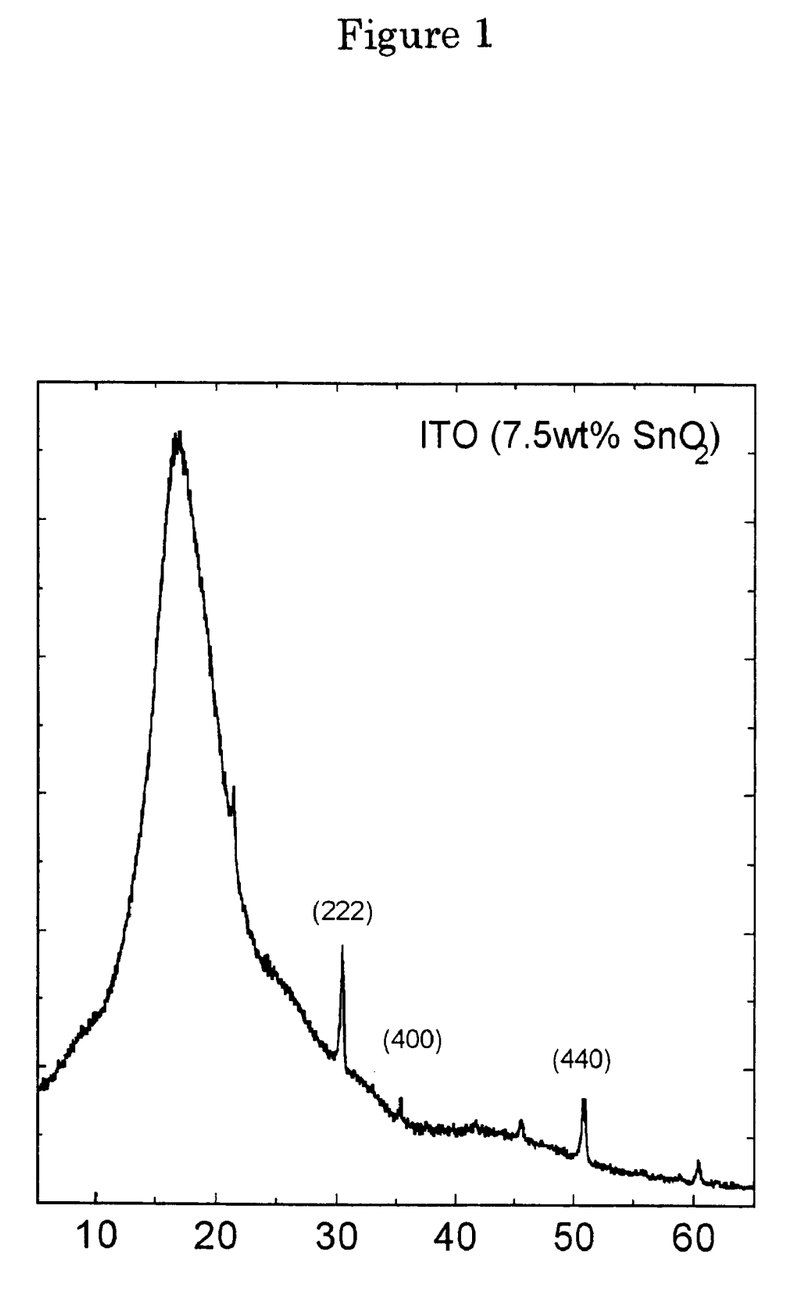
FIG. 1 is an example of an X-ray diffraction chart of an ITO film directly just after film formation (before heat treatment) in the production process for the transparent conductive laminate of the present invention and shows the X-ray diffraction chart directly after film formation of a film fabricated under conditions of the below-mentioned Example 2.

The X-ray diffraction intensities from (222), (400) and (440) crystal planes of the ITO film directly after film fabrication were 1700 cps, 300 cps and 800 cps, respectively as shown in FIG. 1.

The laminate was heat-treated at 130° C. in air. The resistivity after a 0.5-hr heat treatment was $2.5 \times 10^{-4}$ Ω·cm. The resistivity after a 4-hr heat treatment was same as that after the 0.5-hr heat treatment. The total light transmittance after the 4-hr heat treatment was 87%.

As shown in FIG. 2, after the 4-hr heat treatment, the X-ray diffraction intensities from the (222), (400) and (440) crystal planes were 5,500 cps, 700 cps and 3000 cps, respectively; and $[X_{440/222}]$ was 0.55, and $[X_{400/222}]$ was 0.13. The ratio of the X-ray diffraction intensity from (440) crystal plane before heat treatment to that after heat treatment was 0.3.

EXAMPLE 3

A film 130 nm in thickness was fabricated onto a substrate film A 0.1 mm in thickness at 20° C. of substrate temperature from $In_2O_3$ containing 10.0 wt. % of $SnO_2$ by using a DC magnetron sputtering apparatus same as that used in a Example 1, and as a result, a laminate was obtained. In this process, the back pressure in a vacuum chamber to used as a film fabricating section was set at the same level as in Example 1, and then argon as an inert gas was introduced into the vacuum chamber to make the total pressure 0.4 Pa. Further, oxygen was introduced in such a manner that the ratio of an oxygen partial pressure to a water partial became 200. The oxygen partial pressure was $2.7 \times 10^{-3}$ Pa. Further, the ratio of the water partial pressure to an inert gas partial pressure was $3.3 \times 10^{-5}$.

Directly after film fabrication, the resistivity of the ITO film was $5.6 \times 10^{-4}$ Ω·cm, the total light transmittance of the laminate was 80%, the X-ray diffraction intensity from (222) crystal plane of the ITO film was 400 cps, the X-ray diffraction intensity from (400) crystal plane was not detected, and the X-ray diffraction intensity from (440) crystal plane was 150 cps.

The laminate was heat-treated at 130° C. in air. The resistivity of the ITO film after a 0.5-hr heat treatment was $2.0 \times 10^{-4}$ Ω·cm. After a 4-hr heat treatment, the resistivity was same as that after the 0.5-hr heat treatment. The total light transmittance after the 4-hr heat treatment was 86%.

After the 4-hr heat treatment, the X-ray diffraction intensities from the (222), (400) and (440) crystal planes were 4,500 cps, 800 cps and 3000 cps, respectively; and $[X_{440/222}]$ was 0.67, and $[X_{400/222}]$ was 0.18. The ratio of the X-ray diffraction intensity from the (440) crystal plane before heat treatment to that after heat treatment was 0.05.

A color liquid crystal display device was made by using the transparent laminate as an electrode plate. The liquid crystal display device was excellent in flexibility and shock resistance, and had performance applicable even to gradation display.

EXAMPLE 4

A film 130 nm in thickness was fabricated onto a substrate film A 0.1 mm in thickness at 20° C. of substrate temperature from $In_2O_3$ containing 12.5 wt. % of $SnO_2$ by using a DC magnetron sputtering apparatus same as that used in Example 1, and as a result, a transparent conductive laminate was obtained.

The back pressure in a vacuum chamber was set at the same level as in Example 1, and then argon as an inert gas was introduced into the vacuum chamber to make the total pressure 0.4 Pa. Further, oxygen was introduced in such a manner that the ratio of an oxygen partial pressure to a water partial pressure became 260. The oxygen partial pressure was $3.5 \times 10^{-3}$ Pa. Further, the ratio of the water partial pressure to an inert gas partial pressure was $3.3 \times 10^{-5}$.

Directly after film fabrication, the resistivity of the ITO film was $5.5 \times 10^{-4}$ Ω·cm, the total light transmittance of the laminate was 81%, the X-ray diffraction intensity from (222) crystal plane of the ITO film was 200 cps, the X-ray diffraction intensity from (400) crystal plane was not detected, and the X-ray diffraction intensity from (440) crystal plane was 80 cps.

The laminate was heat-treated at 130° C. in air. The resistivity of the ITO film after a 0.5-hr heat treatment was $2.3 \times 10^{-4}$ Ω·cm. The resistivity after a 2-hr heat treatment was $1.8 \times 10^{-4}$ Ω·cm. The heat treatment was performed for 4 hrs, but further reduction of the resistivity was not observed. The total light transmittance after the 4-hr heat treatment was 88%. After the 4-hr heat treatment, the X-ray diffraction intensities from the (222), (400) and (440) crystal planes were 3500 cps, 600 cps and 3500 cps, respectively; and $[X_{440/222}]$ was 0.95, and $[X_{400/222}]$ was 0.16. The ratio of the X-ray diffraction intensity from the (440) crystal plane before heat treatment to that after heat treatment was 0.02.

EXAMPLE 5

A film 130 nm in thickness was fabricated onto a substrate film A 0.1 mm in thickness at 20° C. of substrate temperature from $In_2O_3$ containing 15.0 wt. % of $SnO_2$ by using a DC magnetron sputtering apparatus same as that used in Example 1, and as a result, a transparent conductive laminate was obtained.

The back pressure in a vacuum chamber was set at the same level as in Example 1, and then argon as an inert gas was introduced into the vacuum chamber to make the total pressure 0.4 Pa. Oxygen was not introduced. The ratio of an oxygen partial pressure to a water partial pressure was zero. The ratio of the water partial pressure to an inert gas pressure was $3.3 \times 10^{-5}$.

Directly after film fabrication, the resistivity of the ITO film was $4.1 \times 10^{-4}$ Ω·cm, the total light transmittance of the laminate was 80%, and the X-ray diffraction intensities from (222), (400) and (440) crystal planes of the ITO film were not detected.

The laminate was heat-treated at 130° C. in air. The resistivity of the ITO film after a 0.5-hr heat treatment was $3.3 \times 10^{-4}$ Ω·cm. The resistivity after a 2-hr heat treatment was $1.7 \times 10^{-4}$ Ω·cm, and that after a 4-hr heat treatment was $1.5 \times 10^{-4}$ Ω·cm. The total light transmittance after the 4-hr heat treatment was 88%. After the 4-hr heat treatment, the X-ray diffraction intensities from the (222), (400) and (440) crystal planes were 3000 cps, 450 cps and 5000 cps, respectively; $[X_{440/222}]$ was 1.67, and $[X_{400/222}]$ was 0.15. The ratio of the X-ray diffraction intensity from the (440) crystal plane before heat treatment to that after heat treatment was zero.

EXAMPLE 6

A film 130 nm in thickness was fabricated onto a substrate film B 0.1 mm in thickness at 20° C. of substrate temperature from In2O3 containing 17.5 wt. % of $SnO_2$ by using a DC magnetron sputtering apparatus same as that used in Example 1, and as a result, a laminate was obtained.

The back pressure in a vacuum chamber was set at the same level as in Example 1, and then argon as an inert gas was introduced into the vacuum chamber to make the total pressure 0.4 Pa. Oxygen was not introduced. The ratio of an oxygen partial pressure to a water partial pressure was zero. The ratio of the water partial pressure to an inert gas pressure was $3.3 \times 10^{-5}$.

Directly after film fabrication, the resistivity of the ITO film was $4.8 \times 10^{-4}$ Ω·cm, the total light transmittance of the laminate was 83%, and the X-ray diffraction intensities from (222), (400) and (440) crystal planes of the ITO film were not detected.

The laminate was heat-treated at 150° C., which is a temperature lower than the softening point of the polymer constituting the substrate film B, in air. The resistivity of the ITO film after a 0.5-hr heat treatment was $2.5 \times 10^{-4}$ Ω·cm. The resistivity after a 2-hr heat treatment was $2.5 \times 10^{-4}$ Ω·cm, and that after a 4-hr heat treatment was $1.9 \times 10^{-4}$ Ω·cm. The total light transmittance after the 4-hr heat treatment was 87%. After the 4-hr heat treatment, the X-ray diffraction intensities from the (222), (400) and (440) crystal planes were 1500 cps, 250 cps and 3000 cps, respectively; and $[X_{440/222}]$ was 2.00, and $[X_{400/222}]$ was 0.17. The ratio of the X-ray diffraction intensity from the (440) crystal plane before heat treatment to that after heat treatment was zero.

EXAMPLE 7

A film 130 nm in thickness was formed at 20° C. of substrate temperature from $In_2O_3$ containing 5 wt. % of $SnO_2$ by DC magnetron sputtering using a sintered target consisting of In—Sn—O at a power density of 3 W/cm², onto a substrate film A having the total thickness of 0.105 mm which was applied with two thin layers of phenoxy resin and silicate resin on each of the sides of the substrate film for imparting acid resistance, alkali resistance and organic solvent resistance, and as a result, a transparent conductive laminate was obtained.

The back pressure in a vacuum chamber was set at $1.3 \times 10^{-4}$ Pa, and then argon as an inert gas was introduced into the vacuum chamber to make the total pressure 0.4 Pa. Further, oxygen was introduced in such a manner that the ratio of an oxygen partial pressure to a water partial pressure became 12. The oxygen partial pressure was $1.6 \times 10^{-3}$ Pa. The ratio of the water partial pressure to an inert gas pressure was $3.3 \times 10^{-4}$.

Directly after film fabrication, the resistivity of the ITO film was $5.1 \times 10^{-4}$ Ω·cm, the total light transmittance of the laminate was 84%, and the X-ray diffraction intensities from (222), (400) and (440) crystal planes of the ITO film were not detected.

The laminate was heat-treated at 130° C. in air. The resistivity after a 0.5-hr heat treatment was $2.8 \times 10^{-4}$ Ω·cm. After a 4-hr heat treatment, further lowering of resistivity was not observed. The total light transmittance after the 4-hr heat treatment was 88%. After the 4-hr heat treatment, the X-ray diffraction intensities from the (222), (400) and (440) crystal planes were 6500 cps, 900 cps and 2400 cps, respectively; and $[X_{440/222}]$ was 0.37, and $[X_{400/222}]$ was 0.14. The ratio of the X-ray diffraction intensity from the (440) crystal plane before heat treatment to that after heat treatment was zero.

EXAMPLE 8

A film 130 nm in thickness was fabricated at 20 ° C. of substrate temperature from $In_2O_3$ containing 10 wt. % of $SnO_2$ by DC magnetron sputtering using a sintered target consisting of In—Sn—O at a power density of 1 W/cm², onto a substrate film B having the total thickness of 0.205 mm which was applied with the coating same as in Example 7 on both the sides for imparting acid resistance, alkali resistance and organic solvent resistance, and as a result, a transparent conductive laminate was obtained The back pressure in a vacuum chamber was set at the same level as in Example 1, and then argon as an inert gas was introduced into the vacuum chamber to make the total pressure 0.4 Pa. Further, oxygen was introduced in such a manner that the ratio of an oxygen partial pressure to a water partial pressure became 200. The oxygen partial pressure was $2.7 \times 10^{-3}$ Pa. The ratio of the water partial pressure to an inert gas pressure was $3.3 \times 10^{-5}$.

Directly after film fabrication, the resistivity of the ITO film was $5.3 \times 10^{-4}$ Ω·cm, the total light transmittance of the laminate was 84%, the X-ray diffraction intensity from (222) crystal plane of the ITO film was 600 cps, the X-ray diffraction intensity from (400) crystal plane was not detected, and the X-ray diffraction intensity from (440) crystal plane was 200 cps.

The laminate was heat-treated at 150° C., which is a temperature lower than the softening point of the polymer constituting the substrate film B, for 0.5 hr in air. The resistivity of the ITO film after the heat treatment was $2.1 \times 10^{-4}$ Ω·cm. The extension of the heat treatment to 4 hrs did not change the resistivity. The total light transmittance after a 4-hr heat treatment was 88%. After the 4-hr heat treatment, the X-ray diffraction intensities from the (222), (400) and (440) crystal planes were 5000 cps, 700 cps and 3300 cps, respectively; and [$X_{440/222}$] was 0.66, and [$X_{400/222}$] was 0.14. The ratio of the X-ray diffraction intensity from the (440) crystal plane before heat treatment to that after heat treatment was 0.06.

EXAMPLE 9

A film 130 nm in thickness was fabricated at 20° C. of substrate temperature from $In_2O_3$ containing 10 wt. % of $SnO_2$ by DC magnetron sputtering using a sintered target consisting of In—Sn—O at a power density of 1 W/cm², onto a substrate film C having the total thickness of 0.205 mm which was applied with coating same as in Example 7 on-both the sides for imparting acid resistance, alkali resistance and organic solvent resistance.

The back pressure in a vacuum chamber was set at the same level as in Example 1, and then argon as an inert gas was introduced into the vacuum chamber to make the total pressure 0.4 Pa. Further, oxygen was introduced in such a manner that the ratio of an oxygen partial pressure to a water partial pressure became 200. The oxygen partial pressure was $2.7 \times 10^{-3}$ Pa. The ratio of the water partial pressure to an inert gas pressure was $3.3 \times 10^{-5}$.

Directly after film fabrication, the resistivity of the ITO film was $4.9 \times 10^{-4}$ Ω·cm, the total light transmittance of the laminate was 83%, the X-ray diffraction intensity from (222) crystal plane of the ITO film was 500 cps, the X-ray diffraction intensity from (400) crystal plane was not detected, and the X-ray diffraction intensity from (440) crystal plane was 150 cps.

The laminate was heat-treated at 150° C., which is a temperature lower than the softening point of the polymer constituting the substrate film C, in air. The resistivity of the ITO film after a 0.5-hr heat treatment was $2.2 \times 10^{-4}$ Ω·cm. The extension of the heat treatment to 4 hrs did not change the resistivity. The total light transmittance after a 4-hr heat treatment was 87%. After the 4-hr heat treatment, the X-ray diffraction intensities from the (222), (400) and (440) crystal planes were 4700 cps, 800 cps and 2900 cps, respectively; and [$X_{440/222}$] was 0.62, and [$X_{400/222}$] was 0.17. The ratio of the X-ray diffraction intensity from the (440) crystal plane before heat treatment to that after heat treatment was 0.05.

EXAMPLE 10

In the same way as in Example 1, a film 130 nm in thickness was fabricated at 20° C. of substrate temperature from $In_2O_3$ containing 10 wt. % of $SnO_2$, onto a substrate film A having the total thickness of 0.105 mm which was applied with the coating same as in Example 7 on both the sides for imparting acid resistance, alkali resistance and organic solvent resistance, and as a result, a laminate was obtained.

The back pressure in a vacuum chamber (film fabricating section) was set at the same level as in Example 1, and then argon as an inert gas was introduced into the vacuum chamber to make the total pressure 0.4 Pa. Further, oxygen was introduced in such a manner that the ratio of an oxygen partial pressure to a water partial pressure became 200. The oxygen partial pressure was $2.7 \times 10^{-3}$ Pa. The ratio of the water partial pressure to an inert gas pressure was $3.3 \times 10^{-5}$.

Directly after film fabrication, the resistivity of the ITO film was $5.2 \times 10^{-4}$ Ω·cm, the total light transmittance of the laminate was 84%, the X-ray diffraction intensity from (222) crystal plane of the ITO film was 300 cps, the X-ray diffraction intensity from (400) crystal plane was not detected, and the X-ray diffraction intensity from (440) crystal plane was 100 cps.

The laminate was heat-treated at 130° C. in air. The resistivity of the ITO film after a 0.5-hr heat treatment was $2.2 \times 10^{-4}$ Ω·cm The extension of the heat treatment to 4 hrs did not change the resistivity. The total light transmittance after a 4-hr heat treatment was 88%. After the 4-hr heat treatment, the X-ray diffraction intensities from the (222), (400) and (440) crystal planes were 4500 cps, 800 cps and 3000 cps, respectively; and [$X_{440/222}$] was 0.67, and [$X_{400/222}$] was 0.18. The ratio of the X-ray diffraction intensity from the (440) crystal plane before heat treatment to that after heat treatment was 0.03

EXAMPLE 11

A film 130 nm in thickness was fabricated at 20° C. of substrate temperature from $In_2O_3$ containing 10 wt. % of $SnO_2$ by DC magnetron sputtering using a sintered target consisting of In—Sn—O at a power density of 2 W/cm², onto a substrate film A having the total thickness of 0.105 mm which was applied with the coating same as in Example 7 on both the sides for imparting acid resistance, alkali resistance and organic solvent resistance, and as a result, a transparent conductive laminate was obtained.

The back pressure in a vacuum chamber was set at the same level as in Example 1, and then argon as an inert gas was introduced into the vacuum chamber to make the total pressure 0.4 Pa. Further, oxygen was introduced in such a manner that the ratio of an oxygen partial pressure to a water partial pressure became 150. The oxygen partial pressure was $2.0 \times 10^{-3}$ Pa. The ratio of the water partial pressure to an inert gas pressure was $3.3 \times 10^{-5}$.

Directly after ITO film fabrication, the resistivity of the film was $8.0 \times 10^{-4}$ Ω·cm, the total light transmittance of the laminate was 83%, and the X-ray diffraction intensities from (222), (400) and (440) crystal planes of the ITO film were not detected.

The laminate was heat-treated at 130° C. in air. The resistivity of the ITO film after a 0.5-hr heat treatment was $2.2 \times 10^{-4}$ Ω·cm. The extension of the heat treatment to 4 hrs did not change the resistivity. The total light transmittance after a 4-hr heat treatment was 86%. After the 4-hr heat treatment, the X-ray diffraction intensities from the (222), (400) and (440) crystal planes were 8000 cps, 900 cps and 1800 cps, respectively; and [$X_{440/222}$] was 0.23, and [$X_{400/222}$] was 0.11. The ratio of the X-ray diffraction intensity from the (440) crystal plane before heat treatment to that after heat treatment was zero.

COMPARATIVE EXAMPLE 1

A film 130 nm in thickness was fabricated at 20° C. of substrate temperature from $In_2O_3$ containing 10 wt. % of $SnO_2$ by sputtering according to DC magnetron sputtering using a sintered target consisting of In—Sn—O at a power density of 1 W/cm², onto a substrate film A having the total thickness of 0.105 mm which was applied with the coating same as in Example 7 on both the sides for imparting acid resistance, alkali resistance and organic solvent resistance, and as a result, a laminate was obtained.

The back pressure in a film fabricating section (vacuum chamber) was set at $8.0\times10^{-4}$ Pa, and then argon as an inert gas was introduced into the vacuum chamber to make the total pressure 0.2 Pa. Further, oxygen was introduced in such a manner that the ratio of an oxygen partial pressure to a water partial pressure became 2.7. The oxygen partial pressure was $2.1\times10^{-3}$ Pa. The ratio of the water partial pressure to an inert gas pressure was $4.7\times10^{-3}$.

Of the ITO film directly after film fabrication, the resistivity was $5.8\times10^{-4}$ Ω·cm, the X-ray diffraction intensity from (222) crystal plane was 150 cps, and the X-ray diffraction intensities from (400) and (440) crystal planes were not detected. The total light transmittance of the laminate was 86%.

The laminate was heat-treated at 130° C. in air. The resistivity of the ITO film after a 0.5-hr heat treatment was $5.6\times10^{-4}$ Ω·cm, and it was $5.3\times10^{-4}$ Ω·cm after a 4-hr heat treatment. The total light transmittance after the 4-hr heat treatment was 86%. After the 4-hr heat treatment, the X-ray diffraction intensity from the (222) crystal plane was 600 cps, the X-ray diffraction intensity from the (400) crystal plane was not detected, and the X-ray diffraction intensity from the (440) crystal plane was 100 cps; and $[X_{440/222}]$ was 0.17, and $[X_{400/222}]$ was zero. The ratio of the X-ray diffraction intensity from the (440) crystal plane before heat treatment to that after heat treatment was zero. The results are shown together in Table 1.

COMPARATIVE EXAMPLE 2

When sputtering was carried out in the same way as in Comparative Example 1, the back pressure of a vacuum chamber was set at $1.3\times10^{-5}$ Pa, and then argon as an inert gas was introduced into the vacuum chamber to make the total pressure 0.5 Pa. Oxygen was introduced in such a manner that the ratio of an oxygen partial pressure to a water partial pressure became 1200. The oxygen partial pressure was $1.6\times10^{-2}$ Pa. The ratio of the water partial pressure to an inert gas pressure was $3.1\times10^{-5}$.

Directly after ITO film fabrication, the resistivity of the film was $7.0\times10^{-4}$ Ω·cm, and the total transmittance of the laminate was 86%. Directly after ITO film fabrication, the X-ray diffraction intensity from (222) crystal plane was 8000 cps, the X-ray diffraction intensity from (400) crystal plane was not detected, and the X-ray diffraction intensity from (440) crystal plane was 100 cps.

After the laminate was heat-treated at 130° C. for 0.5 hr in air, the resistivity of the ITO film was $4.5\times10^{-3}$ Ω·cm. The extension of the heat treatment to 4 hrs hardly changed the resistivity. The total light transmittance after a 4-hr heat treatment was 87%. After the 4-hr heat treatment, the X-ray diffraction intensity from the (222) crystal plane was 9000 cps, the X-ray diffraction intensity from the (400) crystal plane was not detected, and the X-ray diffraction intensity from the (440) crystal plane was 80 cps; and $[X_{440/222}]$ was 0.01, and $[X_{400/222}]$ was zero. The ratio of the X-ray diffraction intensity from the (440) crystal plane before heat treatment to that after heat treatment was 1.3. The results are shown together in Table 1.

TABLE 1

|  | (1) | (2) | (3) | (4) | (5) | (6) | (7) | (8) | (9) | (10) |
|---|---|---|---|---|---|---|---|---|---|---|
| Example 1 | 5.0 | 115 | $3.3\times10^{-5}$ | $4.6\times10^{-4}$ | 81 | $4.0\times10^{-4}$ | 82 | 0.20 | 0.02 | 0.70 |
| Example 2 | 7.5 | 160 | $3.3\times10^{-5}$ | $4.8\times10^{-4}$ | 82 | $2.5\times10^{-4}$ | 87 | 0.55 | 0.13 | 0.30 |
| Example 3 | 10.0 | 200 | $3.3\times10^{-5}$ | $5.6\times10^{-4}$ | 80 | $2.0\times10^{-4}$ | 86 | 0.67 | 0.18 | 0.05 |
| Example 4 | 12.5 | 260 | $3.3\times10^{-5}$ | $5.5\times10^{-4}$ | 81 | $1.8\times10^{-4}$ | 88 | 0.95 | 0.16 | 0.02 |
| Example 5 | 15.0 | 0 | $3.3\times10^{-5}$ | $4.1\times10^{-4}$ | 80 | $1.5\times10^{-4}$ | 88 | 1.67 | 0.15 | 0.00 |
| Example 6 | 17.5 | 0 | $3.3\times10^{-5}$ | $4.8\times10^{-4}$ | 83 | $1.9\times10^{-4}$ | 87 | 2.00 | 0.17 | 0.00 |
| Example 7 | 5.0 | 12 | $3.3\times10^{-4}$ | $5.1\times10^{-4}$ | 84 | $2.8\times10^{-4}$ | 88 | 0.37 | 0.14 | 0.00 |
| Example 8 | 10.0 | 200 | $3.3\times10^{-5}$ | $5.3\times10^{-4}$ | 84 | $2.1\times10^{-4}$ | 88 | 0.66 | 0.14 | 0.06 |
| Example 9 | 10.0 | 200 | $3.3\times10^{-5}$ | $4.9\times10^{-4}$ | 83 | $2.2\times10^{-4}$ | 87 | 0.62 | 0.17 | 0.05 |
| Example 10 | 10.0 | 200 | $3.3\times10^{-5}$ | $5.2\times10^{-4}$ | 84 | $2.2\times10^{-4}$ | 88 | 0.67 | 0.18 | 0.03 |
| Example 11 | 10.0 | 150 | $3.3\times10^{-5}$ | $8.0\times10^{-4}$ | 83 | $2.2\times10^{-4}$ | 86 | 0.23 | 0.11 | 0.00 |
| C. Ex. 1 | 10.0 | 2.7 | $4.7\times10^{-3}$ | $5.8\times10^{-4}$ | 86 | $5.3\times10^{-4}$ | 86 | 0.17 | 0.00 | 0.00 |
| C. Ex. 2 | 10.0 | 1200 | $3.1\times10^{-5}$ | $7.0\times10^{-4}$ | 86 | $4.5\times10^{-3}$ | 87 | 0.01 | 0.00 | 1.30 |

In Table 1, abbreviation and numbers are defined as follows.
C. Ex.: Comparative Example
(1): SnO$_2$ concentration in a target (wt. %)
(2): Partial pressure ratio of O$_2$/water
(3): Partial pressure ratio of water/Ar
(4): Resistivity after film fabrication (Ω.cm)
(5): Total light transmittance after film fabrication (%)
(6): Resistivity after heat treatment (Ω.cm)
(7): Total light transmittance after heat treatment (%)
(8): (440)/(222) after heat treatment
(9): (400)/(222) after heat treatment
(10): (440) intensity ratio of before heat treatment/after heat treatment

INDUSTRIAL FIELD OF APPLICATION

In the present invention, an ITO film having controlled fine structure is fabricated onto a thermoplastic polymer film substrate by combining film fabricating under adequate controls of a water partial pressure and an oxygen partial pressure in an atmosphere through back pressure control of a film fabricating section (vacuum chamber) during film fabricating by sputtering, and heat treatment under specific conditions after the film fabricating. In a transparent conductive laminate thus obtained, the resistivity of the transparent conductive film (ITO film) is extremely decreased At the same time, the total light transmittance of the laminate is also improved, and it is made possible to extremely improve the characteristic performance of the transparent conductive laminate.

Thus, the ITO film having the above-mentioned structural properties is a conductive film whose resistivity has been extremely decreased, and when the transparent conductive laminate of the present invention prepared by laminating this ITO polymer film on a film substrate is used in a liquid crystal display device, the obtained display device has performance applicable to gradation display.

As explained above, the process of the present invention gives a transparent conductive laminate having such a low resistivity as unprecedented by forming an ITO film having a decreased resistivity on a thermoplastic polymer film substrate with a low temperature process. Especially, a crystalline transparent conductive film having a low resistance while keeping advantages of a thermoplastic polymer film substrate, such as lightweight, and excellent shock resistance and flexibility, can be formed in high productivity by forming an ITO film at a low substrate-film temperature in a controlled atmosphere by DC magnetron sputtering, and subsequently subjecting the obtained ITO film to a low temperature heat-treatment. The present, invention therefore enables the industrial manufacturing of such a useful transparent conductive laminate as conventionally not available.

What is claimed is:

1. A transparent conductive laminate comprising a crystalline transparent conductive film substantially consisting of In—Sn—O and a transparent substrate composed of a thermoplastic polymer film, which is characterized in that the crystalline part of the conductive film has the highest X-ray diffraction intensity from the (222) crystal plane or the (440) crystal plane, the ratio of the X-ray diffraction intensity from the (440) crystal plane to that from the (222) crystal plane is within the range of 0.2 to 2.5 and the ratio of the X-ray diffraction intensity from the (400) crystal plane to that from the (440) crystal plane of the crystalline part is 0.478 or less.

2. A transparent conductive laminate described in claim 1 characterized in that the ratio of the X-ray diffraction intensity from the (400) crystal plane to that from the (222) crystal plane of the crystalline part is 0.2 or less.

3. A transparent conductive laminate described in claim 2 characterized in that the resistivity of the transparent conductive film is $1.3 \times 10^{-4}$ to $4.5 \times 10^{-4}$ $\Omega \cdot cm$.

4. A transparent conductive laminate described in claim 1 characterized in that the ratio of the X-ray diffraction intensity from the (440) crystal plane to that from the (222) crystal plane is 0.3 to 1.2 is and the resistivity of the transparent conductive film is $1.3 \times 10^{-4}$ to $3.0 \times 10^{-4}$ $\Omega \cdot cm$.

5. A transparent conductive laminate described in claim 3 characterized in that the transparent conductive film is mainly composed of indium oxide and contains 2.5 to 25 wt. % of tin oxide.

6. A transparent conductive laminate described in claim 3 characterized in that the thickness of the transparent conductive film is 10 to 300 nm.

7. A transparent conductive laminate described in claim 6 characterized in that the thickness of the thermoplastic polymer film substrate is 0.01 to 0.4 mm.

8. A transparent conductive laminate described in claim 7 characterized in that the thermoplastic polymer film substrate is polycarbonate film.

9. A transparent conductive laminate described in claim 7 characterized in that the thermoplastic polymer film substrate is a coated film having at least one coating layer on its one side or both the sides.

10. A transparent conductive laminate described in claim 1 which comprises a crystalline transparent conductive film substantially consisting of In—Sn—O and a transparent substrate, characterized in that
    (i) the transparent substrate is a transparent thermoplastic polymer film having a thickness of 0.01 to 0.4 mm and
    (ii) the transparent conductive film fabricated onto the transparent substrate has the following features:
        (A) a transparent conductive film consists of a metal oxide having indium oxide as the main component and containing 2.5 to 25 wt. % of tin oxide and has a thickness of 10 to 300 nm,
        (B) the X-ray diffraction intensity from the (222) crystal plane or the (440) crystal plane of the crystalline part is the highest, the ratio of the X-ray diffraction intensity from the (440) crystal plane to that from the (222) crystal plane is in the range of 0.2 to 2.5 and the ratio of the X-ray diffraction intensity the (400) crystal plane of the crystalline part to that from the (222) crystal plane is within the range of 0 to 0.2, and further
        (C) the resistivity of the transparent conductive film is $1.3 \times 10^{-4}$ to $3.0 \times 10^{-4}$ $\Omega \cdot cm$.

11. A transparent conductive laminate described in claim 10 characterized in that the total light transmittance is 80% or more.

12. A process for manufacturing a transparent conductive laminate by fabricating a transparent conductive film onto a transparent substrate consisting of a thermoplastic film by a sputtering method using a target mainly composed of In—Sn—O, which is characterized in that the process comprises
    (a) the transparent conductive film is fabricated onto the substrate while the ratio of an oxygen partial pressure to a water partial pressure in a film fabricating atmosphere during sputtering is kept substantially zero or in the range of 10 to 1000, the ratio of the water partial pressure to an inert gas partial pressure is kept in the range of $2.5 \times 10^{-6}$ to $7 \times 10^{-4}$, and further during film fabricating, the temperature of the substrate is kept lower than 80° C., and
    (b) subsequently, the laminate having the transparent conductive film fabricated onto the substrate is heat-treated at 80 to 150° C. for 0.5 to 12 hr in an oxygen-containing atmosphere.

13. A process for manufacturing a transparent conductive laminate described in claim 12 characterized in that the resistivity of the transparent conductive film before the heat treatment is $4 \times 10^{-4}$ to $1 \times 10^{-3}$ $\Omega \cdot cm$.

14. A process for manufacturing a transparent conductive laminate described in claim 12 characterized in that the resistivity of the transparent conductive film after the heat treatment is $1.3 \times 10^{-4}$ to $4.5 \times 10^{-4}$ $\Omega \cdot cm$, which is decreased from that before the heat treatment.

15. A process for manufacturing a transparent conductive laminate described in claim 12 characterized in that the sputtering atmosphere for fabricating the transparent conductive film is set at a reduced pressure of $2.5 \times 10^{-4}$ Pa or less at first, and subsequently only an inert gas, or an inert gas and oxygen are introduced.

16. A process for manufacturing a transparent conductive laminate described in claim 12 characterized in that a water partial pressure in the sputtering atmosphere for fabricating the transparent conductive film is set at $2.5 \times 10^{-4}$ Pa or less at first, and subsequently only an inert gas, or an inert gas and oxygen are introduced into the atmosphere.

17. A process for manufacturing a transparent conductive laminate described in claim 12 characterized in that the film fabricating is carried out by DC magnetron sputtering.

18. A process for manufacturing a transparent conductive laminate described in claim 12 characterized in that a transparent thermoplastic polymer film substrate having a thickness of 0.01 to 0.4 mm is used as the transparent substrate.

19. A process for manufacturing a transparent conductive laminate described in claim 12 characterized in that polycarbonate film is used as the transparent substrate.

20. A process for manufacturing a transparent conductive laminate described in claim 12 characterized in that argon is used as the inert gas.

21. A process for manufacturing a transparent conductive laminate described in claim 12 in which a transparent conductive film is fabricated onto a transparent substrate composed of a thermoplastic film by a sputtering method using a target mainly composed of In—Sn—O comprises (a-1) a transparent conductive film 10 to 300 nm in thickness is fabricated onto a transparent thermoplastic polymer film substrate 0.01 to 0.4 mm in thickness by DC magnetron sputtering, (a-2) the film fabricating is started while keeping the pressure at $2.5 \times 10^{-4}$ Pa or less at first and a water partial pressure in the film fabricating atmosphere at $2.5 \times 10^{-4}$ Pa or less at the film fabricating section during the said sputtering, (a-3) subsequently, an inert gas and oxygen are introduced into the film fabricating section and thereby the ratio of an oxygen partial pressure to the water partial pressure in the film fabricating atmosphere is brought into the range of 10 to 1000 and the ratio of the water partial pressure to an inert gas partial pressure is brought into the range of $2.5 \times 10^{-6}$ to $7 \times 10^{-4}$, or only an inert gas is introduced and thereby the ratio of the oxygen partial pressure to the water partial pressure in the film fabricating atmosphere is made substantially zero and the ratio of the water partial pressure to the inert gas partial pressure is brought into the range of $2.5 \times 10^{-6}$ to $7 \times 10^{-4}$, (a-4) the temperature of the above-mentioned film is kept below 80° C. during the film fabricating, and (a-5) thus, a laminate having a transparent conductive film of $4 \times 10^{-4}$ to $1 \times 10^{-3}$ Ω·cm in a resistivity fabricated onto the substrate film is obtained, and (b) subsequently, the laminate is heat-treated at 80 to 150° C. for 0.5 to 12 hrs in an oxygen-containing atmosphere, and thereby the resistivity of the transparent conductive film is lowered below the resistivity before the heat treatment to make it $1.3 \times 10^{-4}$ to $3 \times 10^{-4}$ Ω·cm.

22. A liquid crystal display device using a transparent conductive laminate described in claim 1 as an electrode substrate.

23. An electroluminescence device using a transparent conductive laminate described in claim 1 as an electrode substrate.

24. A touch panel using a transparent conductive laminate described in claim 1 as an electrode substrate.

25. A transparent conductive laminate described in claim 1 characterized in that the transparent conductive laminate is formed by fabricating a transparent conductive film on a transparent substrate consisting of a thermoplastic film by a sputtering method using a target mainly composed of In—Sn—O.

26. A transparent conductive laminate described in claim 1 used in a liquid crystal display device as an electrode substrate.

27. A transparent conductive laminate described in claim 1 used in an electroluminescence device as an electrode substrate.

28. A transparent conductive laminate described in claim 1 used as an electrode substrate in a touch panel.

29. A transparent conductive laminate described in claim 1 characterized in that the crystalline transparent conductive film is fabricated by a sputtering method.

* * * * *